United States Patent
Miura et al.

(10) Patent No.: US 7,208,859 B2
(45) Date of Patent: Apr. 24, 2007

(54) BONDED SUBSTRATE, SURFACE ACOUSTIC WAVE CHIP, AND SURFACE ACOUSTIC WAVE DEVICE

(75) Inventors: Michio Miura, Kawasaki (JP); Masanori Ueda, Yokohama (JP); Shunichi Aikawa, Sannohe (JP); Toru Uemura, Sannohe (JP); Kunihisa Wada, Sannohe (JP); Naoyuki Mishima, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 191 days.

(21) Appl. No.: 11/069,048

(22) Filed: Mar. 2, 2005

(65) Prior Publication Data

US 2005/0194864 A1   Sep. 8, 2005

(30) Foreign Application Priority Data

Mar. 3, 2004   (JP) .............................. 2004-058888

(51) Int. Cl.
*H03H 9/25*   (2006.01)
*H01L 41/053*   (2006.01)

(52) U.S. Cl. .................................. 310/313 R; 310/344
(58) Field of Classification Search ............ 310/313 R, 310/313 A, 344
See application file for complete search history.

(56) References Cited

U.S. PATENT DOCUMENTS 5,498,920 A * 3/1996 Okano et al. ............ 310/313 A
6,933,810 B2 * 8/2005 Miura et al. ................ 333/193
7,005,947 B2 * 2/2006 Iwashita et al. ............ 333/193

FOREIGN PATENT DOCUMENTS

| JP | 59-030025 | * | 2/1984 |
| JP | 09-199969 | * | 7/1997 |
| JP | 11-55070 | | 2/1999 |
| JP | 2004-343359 | | 12/2004 |

OTHER PUBLICATIONS

H.Sato, et al.; "Temperature Stable SAW Devices Using Directly Bonded LiTaO3/Glass Substrates"; 1998 IEEE Ultrasonics-Symposiu; 1998, pp. 335-338.
Low Temperature Bonding by Means of the Surface Activated Bonding Method; Tadatomo Suga (Research Center for Advanced Science and Technology, The University of Tokyo, Japan) pp. 496-612.
Room-Temperature Bonding of Silicon Wafers by Means of the Surface Activation Method; Report of Mechanical Engineering Laboratory No. 189.

* cited by examiner

*Primary Examiner*—Thomas M. Dougherty
(74) *Attorney, Agent, or Firm*—Arent Fox PLLC.

(57) ABSTRACT

A bonded substrate includes a lithium tantalate substrate and a sapphire substrate to which the lithium tantalate substrate is bonded, a bonded interface of the lithium tantalate and the sapphire substrate includes a bonded region in an amorphous state having a thickness of 0.3 nm to 2.5 nm. The bonded region in the amorphous state is formed by activating at least one of the lithium tantalate substrate and the sapphire substrate in the bonded interface with neutralized atom beams, ion beams or plasma of inert gas or oxygen. It is possible to bond the piezoelectric substrate to the supporting substrate having different lattice constants without the high-temperature thermal treatment and realize the bonded substrate having an excellent bonding strength and being less warped.

4 Claims, 5 Drawing Sheets

BONDED SUBSTRATE, SURFACE ACOUSTIC WAVE CHIP, AND SURFACE ACOUSTIC WAVE DEVICE

BACKGROUND OF THE INVENTION

1. Field of the Invention

This invention generally relates to a bonded substrate and a surface acoustic wave chip, and more particularly, to a substrate in which a lithium tantalate substrate and a sapphire substrate are bonded and a surface acoustic wave chip equipped with the bonded substrate.

2. Description of the Related Art

A surface acoustic wave (hereinafter referred to as SAW) device is produced with a piezoelectric substrate having comb-like electrodes thereon. A high-frequency power is applied to one comb-like electrode to generate surface acoustic waves, and another comb-like electrode converts the surface acoustic waves into high-frequency signals.

The SAW device has a wavelength smaller than that of an electromagnetic wave by $10^{-5}$. Therefore, the SAW device can be downsized. The SAW device has a high efficiency in propagation because of a low loss. Additionally, the technique on semiconductor manufacturing processes can be used for the production of the SAW device. This realizes the mass-production and low cost. The SAW device is widely used as a bandpass filter in a communication device such as a mobile telephone.

In recent years, a higher performance has been required for a filter in which the SAW chip is included, according to the high performance of the mobile telephone. One of the requirements for the high performance is the improvement in the temperature stability of the SAW chip. Lithium tantalite (LT) and lithium niobate (LN) are piezoelectric materials having large electromechanical coupling coefficients, which are suitable for realizing the filter characteristics of a wide band. Thus, LT and LN are widely employed in the piezoelectric material of the SAW chip. However, LT and LN have a drawback of inferior temperature stability. The SAW chip made with the above-mentioned piezoelectric materials has a problem in that the passband depends on temperature. In contrast, a quartz crystal, which is also a piezoelectric material of the SAW chip, is superior in the temperature stability, but has a drawback of the small electromechanical coupling coefficient.

As described, as a general tendency of the piezoelectric materials, the piezoelectric materials have two contradictory characteristics. The piezoelectric material having a large electromechanical coupling coefficient is inferior in the temperature stability. In contrast, the piezoelectric material having a small electromechanical coupling coefficient is superior in the temperature stability.

Some techniques have been proposed in order to realize the piezoelectric material having a large electromechanical coupling coefficient and an excellent temperature stability. For example, according to Ohnishi, et al. "Proc. of IEEE Ultrasonic Symposium", pp. 335–338 (1998) (hereinafter referred to as Document 1), a thin piezoelectric substrate is directly bonded to a thick piezoelectric supporting substrate having a low expansion. Thus, the temperature stability can be improved by suppressing the expansion and contraction caused resulting from the temperature changes. Specifically, the piezoelectric substrate such as LT is mirror finished on both sides thereof. Glass is used for the supporting substrate. The piezoelectric substrate and the supporting substrate are immersed in an aqueous solution into which ammonium hydroxide and hydrogen peroxide solution are mixed to be hydrophilic. Then, the both substrates are rinsed with pure water, and both substrate surfaces are terminated with hydroxyl. When main surfaces of the both substrates are superimposed, moisture is gradually removed and the main surfaces and sub substrates are solidly bonded because of the intermolecular force of hydroxyl, oxygen, and hydrogen (initial bonding). After the initial bonding, the both substrates are heat-treated at least at 100° C. for a few dozens of minutes to a few dozens of hours. The bonded substrate without any residual stress at room temperature is thus obtained (Refer to Document 1 and Japanese Patent Application Publication No. 11-55070 (hereinafter referred to as Document 2)).

The bonding methods disclosed in Document 1 and Document 2, however, need an annealing process at high temperatures. A low expansion material having a small Young's modulus such as glass has to be used for the supporting substrate so that the substrate may not be damaged during annealing. The strain, which is generated by the difference in the thermal expansion coefficients in the bonded substrate, is not transmitted to the piezoelectric substrate sufficiently. This results in an unsatisfactory improvement in the temperature characteristics.

In the case where a single-crystal piezoelectric substrate such as LT is bonded to a single-crystal supporting substrate such as sapphire, the lattice constants of the both substrates are generally different. Even in the case where polycrystalline substrate or ceramics substrate is used for the piezoelectric substrate or the supporting substrate, in most cases, the piezoelectric substrate and the supporting substrate have different lattice constants. If the piezoelectric substrate and the supporting substrate have different lattice constants, a lattice mismatch occurs at the bonded interface and a distortion is thus generated at the bonded interface. Here, this causes problems in that the bonding strength is degraded and the yield ratio of the device becomes lowered.

SUMMARY OF THE INVENTION

It is a general object of the present invention to provide a SAW chip in which a piezoelectric substrate (lithium tantalate substrate) and a supporting substrate (sapphire substrate) having different lattice constants are bonded without subjected to a thermal treatment at high temperatures.

A more specific object of the present invention is to provide the SAW chip having a bonded substrate of a sufficient bonding strength, a small distortion, and an excellent temperature stability.

According to an aspect of the present invention, preferably, there is provided a bonded substrate including a lithium tantalate substrate; and a sapphire substrate to which the lithium tantalate substrate is bonded. A bonded interface of the lithium tantalate and the sapphire substrate includes a bonded region in an amorphous state having a thickness of 0.3 nm to 2.5 nm.

According to another aspect of the present invention, preferably, there is provided a surface acoustic wave chip including a lithium tantalate substrate having a first surface on which comb-like electrodes are provided and a second surface, and a sapphire substrate to which the second surface of the lithium tantalate substrate is bonded, a bonded interface of the lithium tantalate and the sapphire substrate includes a bonded region in an amorphous state having a thickness of 0.3 nm to 2.5 nm.

According to further aspect of the present invention, preferably, there is provided a surface acoustic wave device including a package, and a surface acoustic wave chip hermetically sealed by the package. The surface acoustic wave chip may include a lithium tantalate substrate having a first surface on which comb-like electrodes are provided and a second surface, and a sapphire substrate to which the second surface of the lithium tantalate substrate is bonded. A bonded interface of the lithium tantalate and the sapphire substrate includes a bonded region in an amorphous state having a thickness of 0.3 nm to 2.5 nm.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
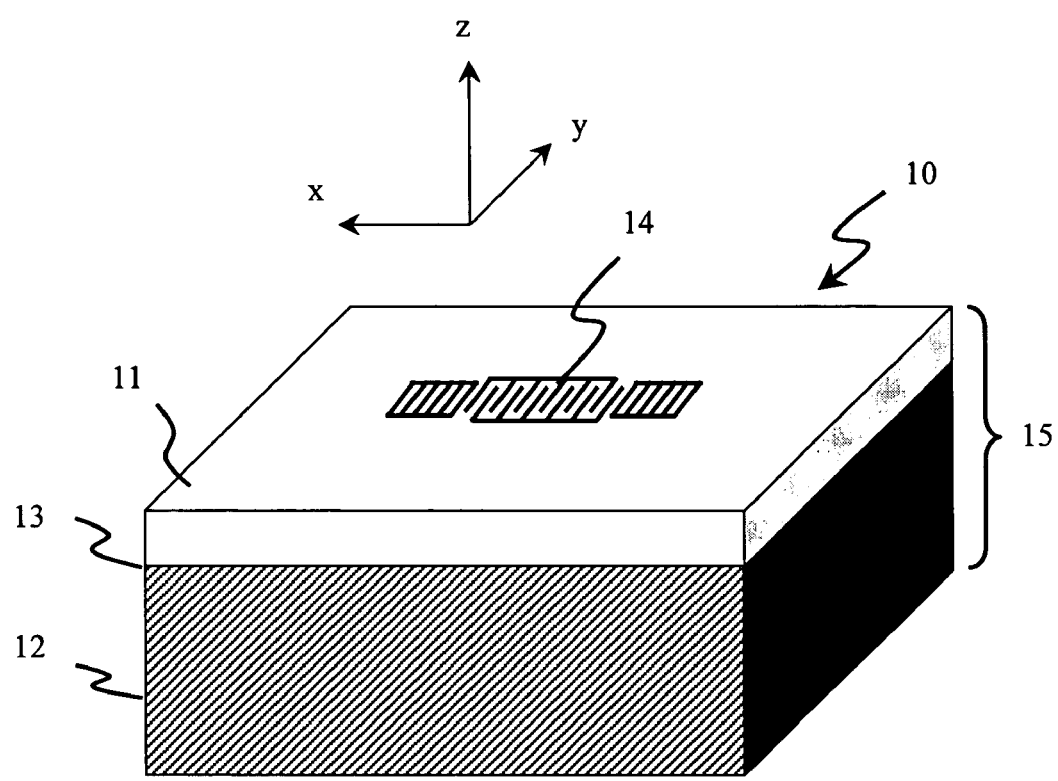
FIG. 1 is a perspective view of a SAW chip made with a bonded substrate in accordance with the present invention.

FIG. 1 is a perspective view of a SAW chip made with a bonded substrate in accordance with the present invention. A SAW chip 10 includes a bonded substrate 15. The bonded substrate 15 includes a piezoelectric substrate 11, a supporting substrate 12, and a bonded interface 13 in an amorphous state. The piezoelectric substrate 11 and the supporting substrate 12 are bonded through the bonded interface 13. A SAW resonator 14 is provided on a main surface of the piezoelectric substrate 11 so that the SAW propagates in the X direction.

The piezoelectric substrate 11 employs a single-crystalline LT substrate of 42-degree rotated Y-cut around the X-axis of a propagation direction (42° Y-cut X-propagation LT substrate). The single-crystalline LT substrate has a thickness of 40 µm. The linear expansion coefficient of the SAW propagation direction X of the single-crystal LT substrate is 16.1 ppm/° C. The supporting substrate 12 is made of the sapphire substrate having a thickness of 250 µm of an R face cut. The linear expansion coefficient of the SAW propagation direction X of the single-crystal sapphire substrate is 5.3 ppm/° C. The sapphire substrate has a smaller linear expansion coefficient than that of the LT substrate, and is easy to be processed.

The piezoelectric substrate 11 of the LT substrate and the supporting substrate 12 of the sapphire substrate are bonded through the bonded interface 13 in the amorphous state, as will be described later in detail. The sapphire substrate suppresses the expansion and contraction of the LT substrate, which enables to reduce the fluctuation in frequencies of the SAW resonator caused resulting from the temperature changes. The frequency temperature coefficient of the SAW resonator shown in FIG. 1 is −25 ppm/° C. and is greatly improved, as compared to that of the SAW resonator having the normal LT substrate, −40 ppm/° C. It can be considered that the frequency temperature coefficient is more improved (approximately 15 ppm/° C.) than the decrease in the thermal expansion coefficient (approximately 9 ppm/° C.) because the stress works more effectively when the expansion and contraction of the LT substrate are suppressed.

Figure 2A:
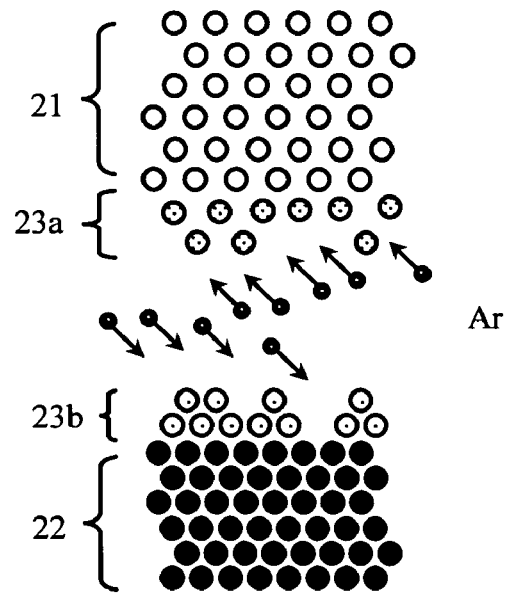
FIGS. 2A through 2C illustrate a bonded interface forming processes in an amorphous state in bonded substrates.
Figure 2B:
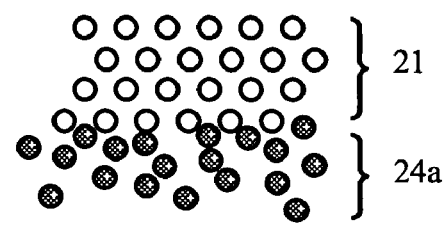
Figure 2C:
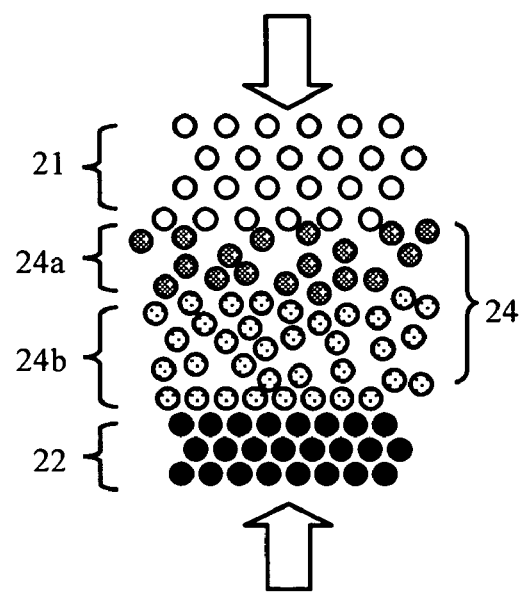
Figure 2C:
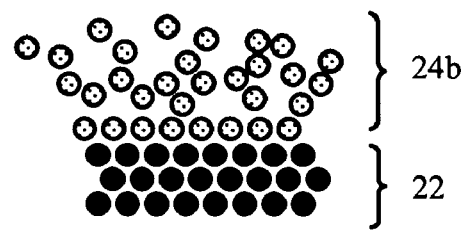

FIGS. 2A through 2C illustrate a bonded interface forming processes in the amorphous state in accordance with the present invention. Here, Ar atom beam is irradiated into the bonded interface of the piezoelectric substrate and the supporting substrate in vacuum so as to randomize (activate) an atomic arrangement on the substrate surfaces, make the amorphous state, and bond the substrates.

Referring to FIG. 2A, there include impurities 23a and 23b on a bonded surface 21 of the piezoelectric substrate and another bonded surface 22 of the supporting substrate. The impurities 23a and 23b are oxides naturally oxidized on the surfaces or those adhered to the surfaces. When the Ar atoms are irradiated into the bonded interface of the substrates, the oxides and impurities are sputtered and removed, and in addition, the atoms on the substrate surfaces are activated by the energy of the Ar atoms.

As a result of the above-mentioned activation, the bonded surface 21 of the piezoelectric substrate and the bonded surface 22 of the supporting substrate turn into the amorphous state (in a nanometer order). Referring to FIG. 2B, an amorphous region 24a is formed on the bonded surface 21 of the piezoelectric substrate, and another amorphous region 24b is formed on the bonded surface 22 of the supporting substrate.

The amorphous region 24a formed on the bonded surface 21 of the piezoelectric substrate is composed of LT, the piezoelectric substrate, and Ar taken in by the beam irradiation. In the same manner, the amorphous region 24b formed on the bonded surface 22 of the supporting substrate is composed of sapphire, the supporting substrate, and Ar taken in by the beam irradiation.

Referring to FIG. 2C, the bonded surface 21 of the piezoelectric substrate and the bonded surface 22 of the supporting substrate, both of which form the amorphous state, are positioned and laminated. Thus, a bonded layer 24 in the amorphous state is formed in the interface between the bonded surface 21 of the piezoelectric substrate and the bonded surface 22 of the supporting substrate.

The above-mentioned lamination process is, in many cases, performed in vacuum or in the presence of a high purity inert gas such as nitrogen. This is because the bonding strength is enhanced by preventing the impurities from being absorbed into the substrate surfaces before bonding and maintaining the amorphous state of the substrate surfaces formed by the Ar atom beam irradiation. However, in some cases, it is possible to obtain a sufficient bonding strength even laminated in the air, depending on the characteristics of the surfaces to be bonded together or the desirable bonding strength, namely, chemical characteristics such as activity level on the surfaces. In addition, when the substrate surfaces are laminated, the both substrates may be sandwiched and pressed as necessary.

The above-mentioned lamination process may be performed under the heating condition of approximately 100° C. or less, according to the bonding strength to be obtained. The temperature dependence is not found as far as the bonding strength is checked on the bonded substrate bonded at 5 to 25° C., namely, at room temperature.

In the above-mentioned process, the Ar atom beams are irradiated to activate the substrate surfaces. However, neutralized atom beams, ion beams or plasma of inert gas or oxygen may be irradiated or exposed. In addition, one of the substrate surfaces may be activated and bonded instead of the activation process on the both substrates. Further, an amorphous film having a different substrate composition may be laminated on one of the bonded surfaces of the piezoelectric substrate and the supporting substrate.

Figure 3:
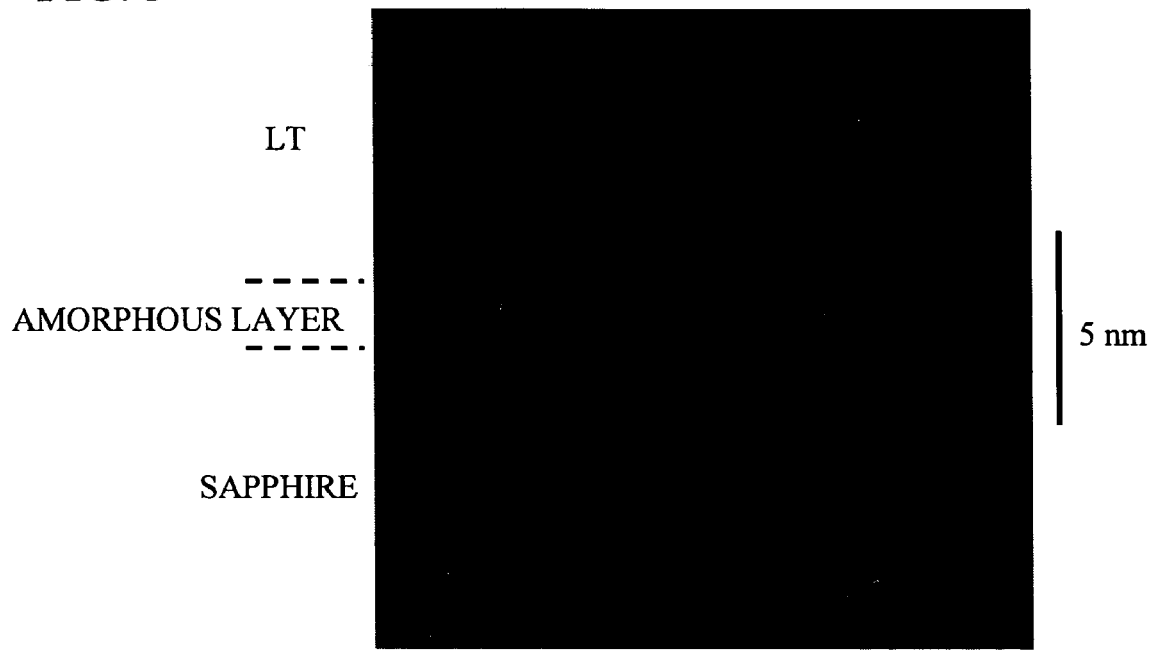
FIG. 3 shows lattices arranged in the bonded interface of a LT substrate and a sapphire substrate taken with a transmission electron microscope.

FIG. 3 is a cross-sectional view of the lattices in the bonded interface of thus bonded substrate of the LT substrate and the sapphire substrate, which is taken by a transmission electron microscope. An amorphous layer can be observed in the bonded interface of the LT substrate and the sapphire substrate. The amorphous layer does not include a long cycle of the lattice arrangement, although the LT substrate and the sapphire substrate respectively show distinct lattice images including cyclic lattice arrangements. In this observation sample, the amorphous layers of the LT substrate and the sapphire substrate have a thickness of approximately 1.7 nm.

Figure 4:
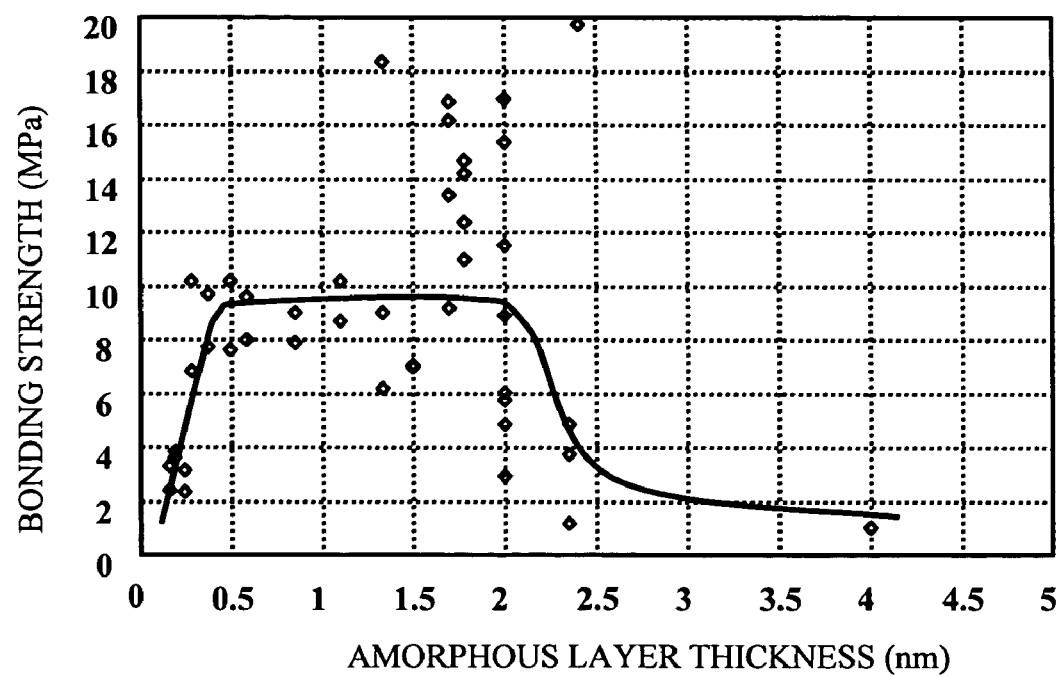
FIG. 4 illustrates a relationship between a thickness of an amorphous layer and the bonding strength.

FIG. 4 illustrates a relationship between the thickness of the amorphous layer and the bonding strength. The horizontal axis denotes the thickness of the amorphous layer. The vertical axis denotes the bonding strength of the bonded substrate. Here, in order to measure the bonding strength, the bonded substrates are diced into 5-mm cubes with a dicing saw, and a stainless-steel jig for a tensile test is applied to both sides of a sample by an epoxy adhesive. After the adhesive becomes hardened, the tensile test is performed at a rate of 15 mm/min with a tension tester. As shown in FIG. 4, the bonding strength is low in the thin amorphous layer. As the amorphous layer becomes thick, the bonding strength becomes higher. When the bonding strength reaches 8 to 10 MPa in the thickness of approximately 0.3 nm, the bonding strength tends to be saturated once. When the thickness of the amorphous layer exceeds 1.5 nm, the bonding strength tends to increase drastically, but the bonding strength varies widely. When the thickness exceeds 2.5 nm, the bonding strength is lowered.

The bonding strength becomes higher, as the thickness of the amorphous layer becomes thick. Then, the bonding strength is lowered drastically. This is because the amorphous region is formed on the substrate surface by irradiating the Ar atom beams in accordance with the present invention. If the beam irradiation period is long or the irradiation power is strong, the amorphous region will be thick and the substrate surfaces will be increasingly rough. As a result, the substrate region related to the effective bonded substrate becomes small, and the bonding strength is lowered.

As shown in FIG. 4, the bonded substrate having a high bonding strength is obtainable by configuring the thickness of the amorphous layer to 0.3 to 2.5 nm, provided in the interface between the LT substrate and the sapphire substrate. If the bonding strength is enhanced, it is possible to suppress cutouts or peel-offs of the SAW chip, when the SAW chips are diced into chips. It is thus possible to improve the yield ratio, and in addition, the impact resistance is improved after the chip is incorporated into a product. Thus, the SAW chip having a high reliability can be realized.

As another important factor required for the bonded substrate, in addition to the bonding strength, it is desirable to have only a small warp after a thermal treatment. In some cases, the thermal treatment is required in the production process of the SAW device. If the substrate is warped after the thermal process, it will be hard to attach the substrate to a stage in the dicing process. The productivity drastically decreases.

For example, an Au bump is sometimes formed on the chip for arranging input and output terminals or a ground terminal. The Au bump forming process is performed before the multiple SAW filters formed on the bonded substrate are diced into chips. So, the bonded substrate is heated on a hot plate at approximately 150° C. Generally, it takes one hour or so to perform the thermal process in the Au bump forming process, although a time for the thermal process varies depending on the chip number of the SAW filters formed on the bonded substrate or the number of the Au bumps. During the thermal process, the bonded substrate is maintained at the temperature of approximately 150° C. Therefore, the amorphous layer provided in the bonded interface has to be optimized in order to realize the bonded substrate having an excellent bonding strength and being less warped.

Figure 5:
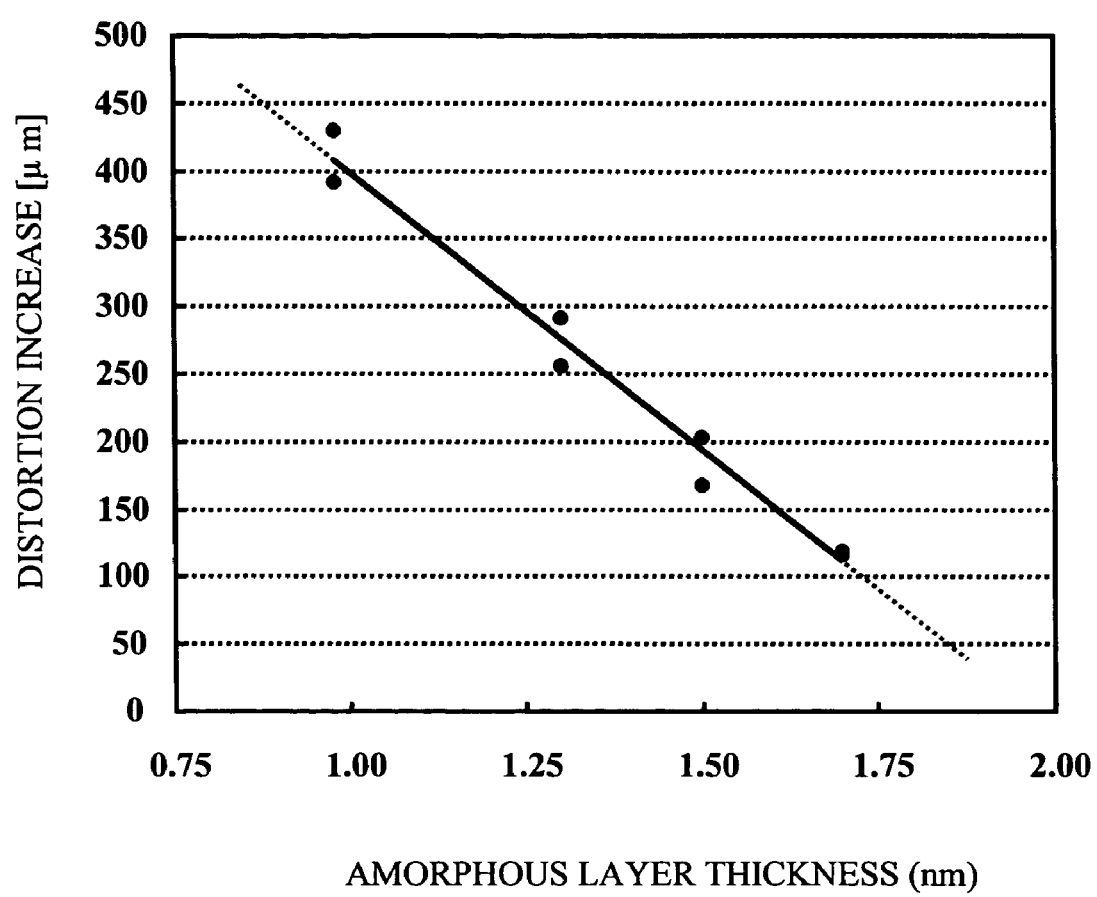
FIG. 5 shows a relationship between an increased amount of warp and the thickness of the amorphous layer after the Au bump forming process.

FIG. 5 shows a relationship between the increased amount of warp and the thickness of the amorphous layer after the Au bump is formed. Here, the amount of warp of the bonded substrate is measured with positional information, which is given by a reflected light when a laser light of 750 nm is irradiated on the substrate to be measured. In this manner, the amount of warp is measured before and after annealing. The difference is the amount of increased warp. As shown in FIG. 5, the amount of increased warp simply decreases as the amorphous layer becomes thicker. In other words, the amorphous layer has to be thick as much as possible in order to obtain the less warped bonded substrate. In the dicing process of the SAW filter after the Au bump forming process, if the warp of the bonded substrate exceeds approximately 200 μm, it is hard to attach the substrate on the stage such as a dicing device. Therefore, the amorphous layer is determined so that the amount of warp of the bonded substrate may be less than 200 μm after the above-mentioned processes.

Judging from the result shown in FIG. 5, the amorphous layer is set to at least 1.5 nm to have the increased amount of warp 200 μm or less. Considering this result and the dependence of the bonding strength on the amorphous layer, the amorphous layer has to be configured within the range of 1.5 to 2.5 nm in order to achieve the bonded substrate having an excellent bonding strength and being less warped.

The SAW chip shown in FIG. 1 is obtainable by arranging on the main surface of the LT substrate of the above-mentioned bonded substrate, at least one comb-like electrode (IDT), an electrode pad, an interconnection pattern, and a SAW resonator 14. The electrode pad serves as an electric terminal to connect outside. The interconnection pattern connects the IDT and the electrode pad.

As described, it is possible to bond the piezoelectric substrate and the supporting substrate readily and solidly, by performing the relatively simple activation process on the bonded interface of the LT substrate and the sapphire substrate. It is thus possible to provide the SAW chip having a large electromechanical coupling coefficient and improved frequency temperature characteristics.

Figure 6A:
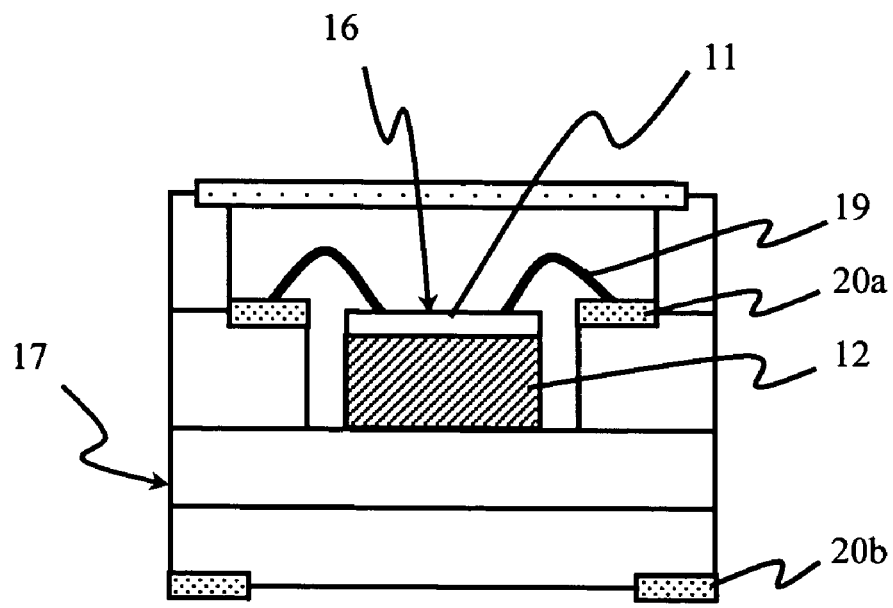
FIGS. 6A and 6B show an example of a SAW device in accordance with the present invention.
Figure 6B:
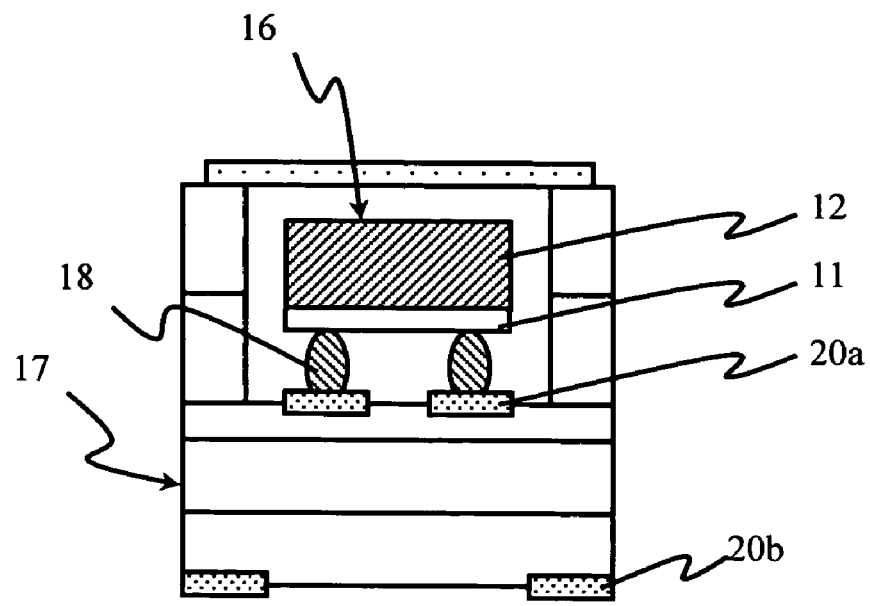

FIGS. 6A and 6B show an example of a SAW device in accordance with the present invention. The SAW chip in accordance with the present invention is mounted and hermetically sealed by a package. FIG. 6A shows the SAW chip mounted into a package by wire (wire bonding method). FIG. 6B shows the SAW chip mounted into a package by Au bump connection (flip chip mounting). In the wire bonding method (shown in FIG. 6A), a backside of the chip 16 corresponding to the side of the supporting substrate 12, is bonded and secured to the chip mounting surface of a package 17. In the flip chip mounting (shown in FIG. 6B), the surface of the chip 16 corresponding to the side of the piezoelectric substrate 11 is secured to the chip mounting surface of the package 17 through a bump 18. In any method, a terminal, not shown, provided on the side of the piezoelectric substrate 11 of the chip 16, is connected to an internal connection terminals 20a of the package 17 by wires 19 or bumps 18, and is led to an external connection terminal 20b by an interconnection layer, not shown, provided in the package 17.

On the conventional SAW device, on which the SAW chip produced with the LT substrate is mounted by flip chip mounting, the thermal expansion coefficients are different in the LT substrate and a package material. When the temperature changes, a force is applied to the bump made of Au or the like, and the bump is damaged in some cases. In order to deal with the force applied to the bump, bumps are provided more than necessary for electric connection.

In contrast, on the SAW chip in accordance with the present invention in which the bonded substrate of LT and sapphire is employed, the thermal expansion coefficient of the bonded substrate is almost identical to that of the package material of the SAW chip, such as alumina, glass ceramics, and the like. The thermal expansion coefficient on the LT substrate surface is the same level as that of the package material, and the force significantly caused resulting from the temperature change is thus decreased. This makes it possible to improve the reliability and reduce the number of the bumps in the SAW device that employs flip chip mounting in accordance with the present invention. In the same manner, it is also possible to improve the reliability and reduce the number of the bumps in the SAW device that employs the wire bonding method in accordance with the present invention.

It is possible to bond the piezoelectric substrate to the supporting substrate having different lattice constants without the high-temperature thermal treatment and realize the bonded substrate having an excellent bonding strength and being less warped. It is also possible to provide the SAW chip having a large electromechanical coupling coefficient and excellent temperature stability.

The present invention is not limited to the above-mentioned embodiments, and other embodiments, variations and modifications may be made without departing from the scope of the present invention.

The present invention is based on Japanese Patent Application No. 2004-058888 filed on Mar. 3, 2004, the entire disclosure of which is hereby incorporated by reference.

What is claimed is:

1. A surface acoustic wave chip comprising:
   a lithium tantalate substrate having a first surface on which comb-like electrodes are provided and a second surface; and
   a sapphire substrate to which the second surface of the lithium tantalate substrate is bonded,
   a bonded interface of the lithium tantalate and the sapphire substrate including a bonded region in an amorphous state having a thickness of 0.3 nm to 2.5 nm.

2. The surface acoustic wave chip as claimed in claim 1, wherein the lithium tantalate substrate is a rotated Y-cut X-propagation plate.

3. A surface acoustic wave device comprising:
   a package; and
   a surface acoustic wave chip hermetically sealed by the package,
   the surface acoustic wave chip comprising:
   a lithium tantalate substrate having a first surface on which comb-like electrodes are provided and a second surface; and
   a sapphire substrate to which the second surface of the lithium tantalate substrate is bonded,
   a bonded interface of the lithium tantalate and the sapphire substrate including a bonded region in an amorphous state having a thickness of 0.3 nm to 2.5 nm.

4. The surface acoustic wave device as claimed in claim 3, wherein the package is made of alumina or glass ceramics.

* * * * *